United States Patent [19]

Maher

[11] Patent Number: 4,633,366
[45] Date of Patent: Dec. 30, 1986

[54] LAMINAR ELECTRICAL COMPONENT WITH MAGNESIUM ORTHOBORATE

[75] Inventor: Galeb H. Maher, North Adams, Mass.

[73] Assignee: Sprague Electric Company, North Adams, Mass.

[21] Appl. No.: 763,388

[22] Filed: Aug. 7, 1985

[51] Int. Cl.$^4$ .............................................. H01G 4/10
[52] U.S. Cl. ..................................... 361/321; 501/135
[58] Field of Search ............... 361/320, 321; 29/25.42; 252/521; 501/10, 135

[56] References Cited

U.S. PATENT DOCUMENTS

| | | | |
|---|---|---|---|
| 3,770,529 | 11/1973 | Anderson | 156/3 |
| 3,885,941 | 5/1975 | Maher | 65/18 |
| 3,962,081 | 6/1976 | Yarwood et al. | 75/68 R X |
| 4,027,209 | 5/1977 | Maher | 361/361 |
| 4,101,952 | 7/1978 | Burn | 361/305 |
| 4,127,415 | 11/1978 | Quackenbush et al. | 501/47 |
| 4,221,047 | 9/1980 | Narken et al. | 29/840 |
| 4,266,265 | 5/1981 | Maher | 361/321 |
| 4,308,570 | 12/1981 | Burn | 361/320 |
| 4,464,420 | 8/1984 | Taguchi et al. | 427/96 |

OTHER PUBLICATIONS

H. M. Davis and M. A. Knight, "The System Magnesium Oxide-Boric Oxide" The Journal of the American Ceramic Society, vol. 28, No. 4, Apr. 1, 1945, pp. 97–102.

Primary Examiner—L. T. Hix
Assistant Examiner—Douglas S. Lee

[57] ABSTRACT

A laminar electrical component has at least one ceramic dielectric layer of from 85 to 100 mole percent magnesium orthoborate ($Mg_3B_2O_6$) which has a low dielectric constant and a high Q. A monolithic ceramic capacitor may have a predominantly magnesium orthoborate body with lithium oxide as a flux so that sintering may be as low as 850° C. and in a reducing atmosphere accommodating buried copper electrodes. A predominantly $Mg_3B_2O_6$ multi-level printed wiring substrate of low dielectric constant can include tightly adhered layers of a high dielectric constant ceramic for making buried high capacity filter capacitors, and can also include cofired base metal conductors.

22 Claims, 4 Drawing Figures

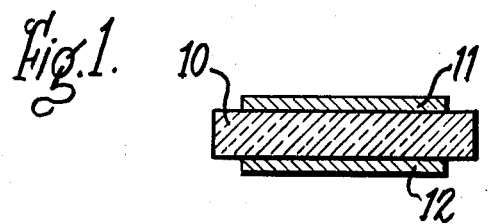
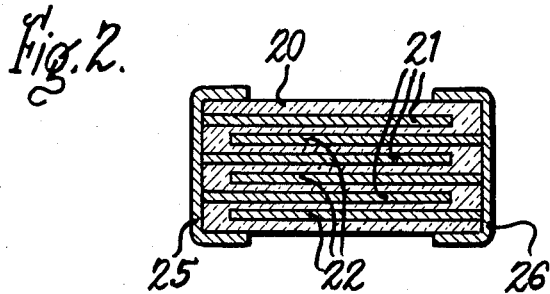
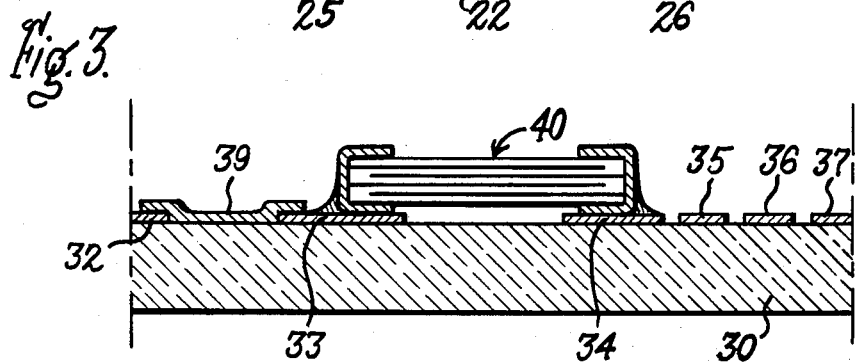
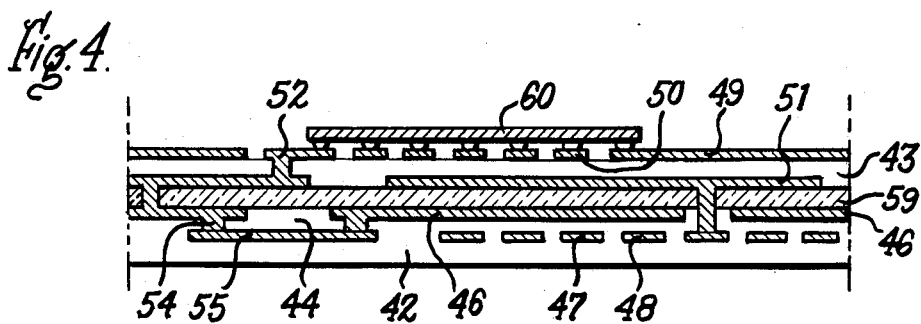

LAMINAR ELECTRICAL COMPONENT WITH MAGNESIUM ORTHOBORATE

BACKGROUND OF THE INVENTION

This invention relates to a laminar electrical component and more particularly to wafer capacitors, multi-dielectric layer capacitors, and printed circuit assemblies all of which employ ceramic dielectric bodies that are comprised mainly of magnesium orthoborate.

It is well known to employ borate fluxes mixed with dominant quantities of a high firing ceramic to make dielectric ceramic bodies as is exemplified in my patents U.S. Pat. Nos. 3,885,941 issued May 27, 1975 and 4,027,209 issued May 31, 1977; and which is further exemplified in patents to I. Burns U.S. Pat. Nos. 4,101,952 issued July 18, 1978 and 4,308,570 issued Dec. 29, 1981. These four patents are assigned to the same assignee as is the present invention. However, all of the borate fluxes having been used as sintering aids in the prior art with the exception of several of the sintering aids claimed in my patent U.S. Pat. No. 4,533,974 issued Aug. 6, 1985 are glasses rather than being crystalline and they have a melting temperature less than the characteristic minimum sintering temperature of the high firing ceramic with which they are mixed to serve as a sintering aid.

The addition of these low melting glass fluxes reduces the temperature necessary for sintering by providing a vehicle for a liquid phase sintering mechanism. The only known exception to this behavior is produced by crystalline cadmium silicates which is described in my patent U.S. Pat. No. 4,266,265 issued May 5, 1981 and assigned to the same assignee. But of course, this flux is not a borate and there is no theory or key, by which such a crystalline compound that will be useful as a sintering aid or flux, will be recognizable.

It is also capable of being "fluxed" with high melting materials like barium oxide. It is the reaction of the boron in the magnesium orthoborate in a limited surface reaction with the "flux" to produce a eutectic and leading to liquid phase sintering at temperatures well below the melting point of either the "flux" or the magnesium orthoborate. For no other high firing dielectric than magnesium orthoborate is this known to be true.

Furthermore, the compound of central interest here, magnesium orthoborate, is a very obscure material. Except for its having received academic attention as one of the three single phase magnesium borates, it has apparently found no use.

It is an object of this invention to provide useful laminar electrical components having a dielectric ceramic body comprised predominantly of magnesium orthoborate.

It is a further object of this invention to provide a very dense, high Q and high frequency ceramic with a low dielectric constant as a dielectric body in laminar electrical components such as wafer capacitors, monolithic capacitors, and printed wiring substrates.

It is yet a further object of this invention to provide such components that are capable of being made by a process including cofiring the ceramic and metal elements.

It is still a further object of this invention to provide such components that incorporate base metals and may be sintered in a reducing atmosphere.

It is even a further object of this invention to provide such components that further include other high firing ceramic materials without exhibiting cracking and delamination after co-sintering.

SUMMARY OF THE INVENTION

A method for making a laminar electrical component includes the steps of preparing a start ceramic powder comprised of from 85 to 100 mole percent magnesium orthoborate, $Mg_3B_2O_6$. A slurry is formed by dispersing the start ceramic powder in a liquid vehicle. A layer of this slurry is put down on a substrate and dried. An electroding ink film is deposited on a portion of the dried layer. The dried slurry layer is sintered to densify and mature the ceramic. The electroding ink is fired and sintered into a solid conductive film in contact with the ceramic.

That assembly may form the nucleus for numerous laminar electronic components such as ceramic wafer capacitors, monolithic ceramic capacitors and printed circuit boards.

As is further described herein, magnesium orthoborate possesses a unique combination of properties that can lead to high performance electrical components. Briefly, the dielectric constant, 7.2, of magnesium orthoborate is quite low making it possible to build small capacity capacitors to tight tolerances and in printed circuit substrates reduces interwiring capacitances. This feature is combined with a high Q (low DF) at very high frequencies, a high density and a high bond strength with adjacent cofired ceramics of a different composition which gives great versatility of design in multi-layer printed wiring substrates. It is also capable of being fired in air or cofired with buried base metal electrodes such as copper or nickel.

BRIEF DESCRIPTION OF THE DRAWING

FIG. 1 shows in side sectional view, a wafer capacitor having a dominantly magnesium-orthoborate ceramic body.

FIG. 2 shows in side sectional view a monolithic ceramic capacitor having a dominantly magnesium-orthoborate ceramic body.

FIG. 3 shows in side sectional view a printed circuit substrate having a body that is primarily a magnesium-orthoborate-containing ceramic.

FIG. 4 shows a multilayer ceramic printed circuit assembly of this invention having a plurality of strata some of which are formed primarily of magnesium-orthoborate, and having a silicon integrated circuit chip connected thereto.

DESCRIPTION OF THE PREFERRED EMBODIMENTS

In a procedure, designated here as Example 1, $Mg_3B_2O_6$ was made by milling boric acid and magnesium carbonate. Both compounds were milled in acetone and were dried, calcined at 1200° C. and comminuted to form a powder of $Mg_3B_2O_6$ as confirmed by X-ray diffraction analysis. It has an orthohombic crystal structure with an X-ray theoretical ultimate density of 3.10 grams/cm$^3$.

A number of experimental wafer type capacitors were made and are illustrated in FIG. 1. The wafer bodies were first formed by the conventional steps of wet milling a start powder for about two hours and drying. The start powder in this example consists of the above-noted $Mg_3B_2O_6$. This was followed by crushing and jet pulverizing to an average particle size of about 1 to 1.5 microns. The fine powder was combined in an organic vehicle and cast squares (about 1 cm$^2$) were formed to about 0.6 mm thickness.

to which was added a small quantity of one or two other powder compounds. The particular compositions investigated are given in Table 1.

TABLE 1

| Ex. | Composition (mole %) | | Minimum Sintering Temp. (°C.) | Oxygen Atmospheres | % Theoretical Density | K | DF at 1 MHz |
|---|---|---|---|---|---|---|---|
| | Mg$_3$B$_2$O$_3$ | Additive | | | | | |
| 5 | 96.3 | 3.7 BaO | 1100 | 10$^{-9}$ | 97.2 | 7.7 | .005 |
| 6 | 96.3 | 3.7 BaO | 1100 | 1 | 97.0 | 7.7 | .01 |
| 7 | 95.08 | 4.92 BaO 0.1 MnCO$_3$ | 1100 | 10$^{-9}$ | 98.0 | 7.7 | .02 |
| 8 | 95.08 | 4.92 BaO 0.1 MnCO$_3$ | 1100 | 1 | 97.8 | 7.7 | .02 |
| 9 | 95.08 | 4.92 BaO | 1100 | 10$^{-9}$ | 97.0 | 7.7 | .01 |
| 10 | 95.08 | 4.92 BaO | 1100 | 1 | 97.8 | 7.7 | .02 |
| 11 | 98.39 | 1.61 X | 1150 | 1 | 94.0 | n.d. | .01 |
| 12 | 98 | 2 Li$_2$O | 1000 | 1 | n.d. | n.d. | n.d. |
| 13 | 97 | 3 Li$_2$O | 900 | 1 | 97.0 | 7.2 | .005 |
| 14 | 97 | 3 Li$_2$O | 900 | 10$^{-9}$ | 96.5 | 7.2 | .02 |
| 15 | 96.1 | 3.9 Li$_2$O | 900 | 1 | n.d. | n.d. | n.d. |
| 16 | 92.4 | 7.6 Li$_2$O | 850 | 1 | n.d. | n.d. | n.d. |
| 17 | 86.8 | 13.2 Li$_2$O | 850 | 1 | n.d. | n.d. | n.d. |

One group of these cast squares, Example 2 was sintered in air at 1200° C. while another group, Example 3, was sintered in an environment of partial oxygen pressure at 10$^{-9}$ atmospheres of oxygen at 1200° C. A silver electroding paste was applied to the 2 major faces of each mature ceramic cast square, or wafer, and the wafers were fired at 800° C. to form wafer capacitors each having bodies 10 and electrodes 11 and 12, as seen in FIG. 1.

The wafer capacitors from the groups of Examples 2 and 3 were essentially identical; namely, being milky white, exhibiting an unusually high density at 97% of that theoretically possible, a dielectric constant of 7.2 and at 1 MHz and 25° C. the DF was less than 0.01%.

In Example 4, another portion of the calcined Mg$_3$B$_2$O$_6$ powder of Example 1 was combined with an organic vehicle to form a slurry that was repeatedly deposited in 5 mil (0.13 mm) thick layers, each layer being dried and having an electroding ink film of 10Ag/90Pd deposited thereon prior to deposition of the next slurry layer. The last three or topmost slurry layers and the first three slurry layers were not coated with the electroding ink. There were 6 electrode films with 5 active dielectric layers therebetween. This assembly was sintered at 1200° C. for 2½ hours to drive off all the organic materials from both the ink and the slurry layers, to alloy the metal to 10Ag/90Pd alloy film electrodes buried in a sintered dielectric block 20 of Mg$_3$B$_2$O$_6$. In this way a monolithic ceramic capacitor was formed as is illustrated in FIG. 2 wherein left-end extending buried electrodes 21 and right-end extending buried electrodes 22 are contacted at the left and right ends respectively by silver terminations 25 and 26.

The density of the ceramic was 97.2% of theoretical and the dielectric constant is 7.2. These monolithic capacitors had a higher capacitance (i.e. 32 pF) than the wafer capacitors of Examples 2 and 3 and consequently it was possible to measure the DF at 10 KHz and at 100 KHz. At 100 KHz the DF is 0.05% and at 1 MHz it remained at less than 0.01%. The temperature coefficient of capacitance was a positive 100 parts per million (P 100 ppm/°C.) at −55° C. and was P 150 ppm/°C. at +125° C.

Various other wafer capacitors were made by the above-noted conventional method steps, employing as the start powder the above-described Mg$_3$B$_2$O$_6$ powder In Examples 5, 7 and 9, the dielectric bodies included various additions of baria and manganese carbonate, and were sintered in a reducing atmosphere at 1100° C. to a very dense mature ceramic. The dielectric constant, K, was raised about 10%. The addition, in Example 5, 3.7 mole percent of baria without manganese carbonate gave about optimum results, i.e. the sintering temperature reduction amounts to about 50° C. and the DF remains extremely low. In Examples 6, 8 and 10, which are respectively the same as Examples 5, 7 and 9 except for having been sintered in air, the results are very similar.

In Example 11, the additive X is the zinc cadmium borate 2ZnO.CdO.B$_2$O$_3$. (Note that this compound-expression is in mole % of the constituent oxides.) This material has been used as a flux additive in other dielectric ceramic bodies for reducing sintering temperature. In this instance, however, it is clearly not as satisfactory as baria. Although the DF is quite low, density of the body is comparatively low and the sintering temperature was reduced less for the same additive amounts.

In Examples 12 through 17, various (molar) amounts of lithium oxide were added to the magnesium borate. The lithium was actually added as lithium carbonate. By sintering a few wafers of each composition at temperatures in 50° C. intervals, the minimum sintering temperatures of each composition was determined.

The efficiency of the lithium additive to reduce the sintering temperature was greatest in Example 13 at the 3 mole % level. The DF remains essentially unaffected except in Example 14, where sintering was effected in a partial oxygen atmosphere achieving nearly the same density by sacrificing DF somewhat.

Using the same 3 mole % Li$_2$O composition as for Examples 13 and 14, a monolithic ceramic capacitor was built, Example 18, having five buried electrodes four "active" 6 mil (0.15 mm) thick dielectric layers having a total capacitance of 32 picofarads. The buried electrodes were the standard electroding alloy 70Ag/30Pd. The dielectric constant is 7.2, DF at 1 MHz is less than 0.01%, the temperature coefficient of capacitance averages 75 ppm/°C. from −55° C. to +125° C., and insulation resistance at 200 volts and 150° C. is greater than 10$^6$ megohms.

Additional requirements of Q were made by a transmission-line method. At 200 MHz, the Q is 150 and at 400 MHz, the Q was found to be about 100 which is equivalent to a DF of 0.01.

Another monolithic ceramic capacitor, Example 19, was made by exactly the same process as were the monolithic capacitors of Example 18 except that a 95Ag/5Pd (by weight) silver-rich alloy was used instead of the 70Ag/30Pd alloy. For this capacitor, the Q at 200 MHz was 4000 and at 400 MHz Q is 350. This demonstrates that at high frequencies, the resistance of the buried electrodes and not this dielectric tend to become the dominant factor affecting the capacitor losses.

Measurements have been made of some of the material properties of magnesium orthoborate, (A) with and (B) without a flux (i.e. 3% lithium oxide). In Table 2 there is given a summary of these properties of the ceramics having been sintered in air at 1200° C. and at 1050° C., respectively.

TABLE 2

|  | A | B |  |
|---|---|---|---|
| Density | 97 | 97% |  |
| IR | $>10^{13}$ | $>10^{13}$ | ohm cm |
| K | 7.2 | 7.25 |  |
| DF @ 1 MHz | <0.01 | 0.02% |  |
| Specific Heat (25° C.) | 1.0 | 0.885 | w. sec./g. °K. |
| Thermal Diffusivity |  | 0.027 | cm$^2$/sec. |
| Thermal Conductivity | n.d. | 0.065 | w./cm. °K. |
| Thermal Coefficient of Expansion | $7.5 \times 10^{-6}$ | $7.5 \times 10^{-6}$ | cm/cm/°C. |
| Thermal Conductivity | n.d. | 0.07 | w./cm/°K. |
| Temperature Coefficient of Capacitance (−55° C. to 125° C.) | 75 | 125 | ppm/°C. |

Note:
n.d. - not determined

Some of these properties are similar to those of the dense alumina bodies used as printed circuit substrates and multilayer circuit boards. For example, the thermal coefficient of expansion is about the same, as is the temperature coefficient of capacitance. However, the magnesium borates of this invention have characteristics that offer significant advantages for these applications.

The sintering temperatures of the magnesium orthoborate dielectrics is substantially lower than the minimum sintering temperature for alumina, namely about 1450° C. This advantage expands the number of materials that would not melt at a cofiring with the ceramic, and a much greater variety of electroding or resistor body metals may be buried in a ceramic multilayer circuit board. Another method, that utilizes a technique of charring a dried emulsion, for making magnesium orthoborate is described in the patent application by N. Cipollini, Ser. No. 745,045 filed June 17, 1985 and assigned to the same assignee as is the present invention. Powders made by this method are very fine and tend to sinter at lower temperatures without flux and are expected to make strong low-firing substrates. It has also been discovered that although the magnesium and boron oxide precursors are hygroscopic, magnesium orthoborate is not, a very important feature of a dielectric ceramic.

The dielectric constant of alumina is 9, about 26% higher than that of the magnesium orthoborate ceramic. This leads to a commensurate reduction in the interwiring capacitances of equal dimensional printed circuit substrates and multilayer circuit boards made with magnesium orthoborate ceramics. Alternatively, the latter may be made smaller before the interwiring capacitances reach the values exhibited by the conventional alumina counterparts.

Referring to FIG. 3, a printed circuit substrate 10, made of a magnesium orthoborate material has a plurality of film conductors 32, 33, 34, 35, 36 and 37 having been formed by screen printing thereon. These conductors may be deposited before or after the sintering of the ceramic substrate. A high resistivity film 39 may be one such as those described by J. Maher in the patent U.S. Pat. No. 3,989,874 issued Nov. 2, 1976 and assigned to the same assignee. A monolithic ceramic capacitor 40, similar to that of FIG. 2, is shown solder mounted to conductors 33 and 34.

In FIG. 4 a multilayer ceramic printed circuit board is made up of magnesium orthoborate material regions, e.g. 42, 43 and 44, that are shown as unhatched areas; metal conductors, e.g. 46, 47, 48, 49, 50, 51 and 52, a high resistivity resistor film 55; and a high dielectric constant ceramic material 59, e.g. a lead barium lanthanum zirconate titanate described in my patent U.S. Pat. No. 4,324,750 issued Apr. 13, 1982 and assigned to the same assignee. The material of Example 7 in the later patent was used and has a dielectric constant of over 1800, to form a buried capacitor having a high capacitance value between conductors 46 and 51. The interwiring capacitance between other conductors, e.g. 51 and 49, have very low values. The conductive vias, e.g. 54, can be made by standard techniques of punching holes in the green ceramic layers and later filling them with metal. A silicon integrated circuit chip 60 is shown face bonded directly to the conductors; e.g. 49, 50 and 52. The face bonding may be accomplished by a conventional means such as heating to reflow solder-bond solder bumps to the substrate conductors or by ultrasonically energizing the assembly.

In Example 20, some of the magnesium borate slurry used to make the monolithic ceramic capacitors of Example 18 was cast on a plate using the doctor blade technique and dried. 70Ag/30Pd electroding ink was printed on a surface of the dried slurry layer. Subsequently, a 1 mil slurry layer of the above-noted lead barium lanthanum zirconate titanate was formed by the same technique over the printed surface, and dried. Again, a printed electroding ink layer was formed and a top layer of magnesium borate slurry was deposited to form a sandwich about the two-surface-electroded titanate layer. This assembly was sintered at 1050° C. in air. The sintered sandwich was sectioned and observed under a microscope. There was complete bonding of the adjacent layers with no evidence of separation or delamination at any point.

Example 20 demonstrates the ability of magnesium orthoborate to cofire with and bond well to other ceramic materials. It is, therefore, a demonstration of basic feasibility of multi-layer circuits like that of FIG. 4.

What is claimed is:

1. A method for making a laminar electrical component comprising:
   (a) preparing a start ceramic powder comprised of from 85 to 100 mole % magnesium orthoborate;
   (b) combining said start powder with a liquid vehicle to form a first slurry;
   (c) forming at least a first layer of said first slurry and drying said slurry;
   (d) depositing one film of an electroding ink on a portion of said first layer;

(e) sintering and transforming said dried layer into a dense ceramic layer and (f) firing and sintering said film of electroding ink to form a conductive film adhered to said first ceramic layer.

2. The method of claim 1 additionally comprising forming over said first layer and said one electroding film, a second layer of a slurry comprised of a mixture of a powdered dielectric material and a liquid carrier, and drying said second layer, wherein said sintering and firing are accomplished simultaneously to form a unitary dense ceramic body having an electrode buried therein.

3. The method of claim 2 wherein said powdered dielectric material has a composition essentially the same as that of said start powder and the composition of said carrier is essentially the same as that of said vehicle so that the compositions of said layers are essentially the same as each other.

4. The method of claim 2 additionally comprising prior to said sintering depositing another film of an electroding ink on an outer portion of said second layer to have a capacitive relationship through said second layer with said one electroding film.

5. The method of claim 4 wherein said depositing accomplishes positioning of said one and another electroding films to extend to and be exposed at opposite ends, respectively, of the assembly of said two layers, so that a monolithic ceramic capacitor is formed after said firing.

6. The method of claim 2 wherein said electroding ink consists essentially of a base metal in a carrying fluid, said firing being accomplished in a low partial oxygen atmosphere below the oxidation/reduction characteristic of said base metal to avoid oxidizing said base metal.

7. The method of claim 6 wherein said base metal is copper.

8. The method of claim 2 wherein, after said firing, said second layer has a substantially larger dielectric constant than that of said first layer.

9. The method of claim 1 wherein said combining includes mixing said start powder with another powder comprising the precursors of another ceramic compound.

10. The method of claim 9 wherein said another compound is a ceramic having a characteristic minimum sintering temperature greater than 1150° C.

11. The method of claim 9 wherein said start powder amounts to less than 10 weight percent of the sum of said start powder and said another powder and said sintering is accomplished at a temperature equal to or less than 1150° C.

12. The method of claim 1 wherein said depositing one film is to form a plurality of patches of said one film that become conductive patches after said firing; and additionally including attaching to said fired ceramic an integrated circuit chip having conductor bumps extending from one face thereof by registering said conductive bumps over said conductive film patches and energizing to form a permanent conductive connection therebetween.

13. A laminar electrical component having a first dense sintered ceramic layer comprised of from 85 to 100 mole % magnesium orthoborate; and at least one fired continuous conductive film adhered to said one layer.

14. The component of claim 13 additionally comprising another sintered ceramic layer overlying said one layer and burying said one conductive film, said ceramic layers having been cosintered to form a unitary ceramic body.

15. The component of claim 14 additionally comprising another conductive film overlying said second ceramic layer to form a capacitor wherein said second ceramic layer serves as the active dielectric.

16. The component of claim 15 wherein said one and another conductive films each extend only to opposite ends of said unitary ceramic body.

17. The component of claim 14 wherein said one buried conductive film is copper.

18. The component of claim 14 wherein said second ceramic layer has a substantially greater dielectric constant than that of said first layer.

19. The component of claim 13 wherein the composition of said second ceramic layer is the same as that of said first ceramic layer.

20. The component of claim 13 wherein said dense sintered ceramic layer consists of from 85 to 100 mole % magnesium orthoborate and from 0 to 15 mole % of a sintering aid.

21. The component of claim 20 wherein said sintering aid is BaO.

22. The component of claim 20 wherein said sintering aid is $Li_2O$.

* * * * *